(12) United States Patent
Moore et al.

(10) Patent No.: US 11,204,274 B2
(45) Date of Patent: Dec. 21, 2021

(54) ULTRAVIOLET SENSING APPARATUS WITH MIRROR AMPLIFICATION

(71) Applicant: UNITED STATES OF AMERICA AS REPRESENTED BY THE ADMINISTRATOR OF NASA, Washington, DC (US)

(72) Inventors: Andrew J. Moore, Williamsburg, VA (US); Nicholas H. Rymer, Hampton, VA (US); Matthew R. Schubert, Newport News, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 532 days.

(21) Appl. No.: 16/159,907

(22) Filed: Oct. 15, 2018

(65) Prior Publication Data
US 2019/0049293 A1  Feb. 14, 2019

Related U.S. Application Data

(63) Continuation-in-part of application No. 15/086,350, filed on Mar. 31, 2016, now abandoned.
(Continued)

(51) Int. Cl.
*G01J 1/42* (2006.01)
*H01J 47/08* (2006.01)
(Continued)

(52) U.S. Cl.
CPC .......... *G01J 1/429* (2013.01); *B64C 39/024* (2013.01); *G01J 1/0219* (2013.01);
(Continued)

(58) Field of Classification Search
CPC combination set(s) only.
See application file for complete search history.

(56) References Cited

U.S. PATENT DOCUMENTS 5,959,301 A  9/1999 Warashina
7,541,938 B1  6/2009 Engelhaupt
(Continued)

OTHER PUBLICATIONS

Andrew J. Moore, Autonomous Inspection of Electrical Transmission Structures with Airborne UV Sensors NASA Report on Dominion Virginia Power Flights of Nov. 2016, NASA/TM-2017-219611 (Year: 2016).*
(Continued)

*Primary Examiner* — Thomas G Black
*Assistant Examiner* — Anthony M Gartrelle
(74) *Attorney, Agent, or Firm* — M. Bruce Harper; Andrea Z. Warmbier; Helen M. Galus (57) ABSTRACT

Systems, methods, and devices of the various embodiments may enable the detection and localization of power line corona discharges and/or electrical arcs by an unmanned aerial vehicle (UAV) including an ultraviolet (UV) sensor and a reflective parabolic dish. In various embodiments, the UV sensor may use the photoelectric effect to sense narrow-band UV photons in a Geiger-Mueller tube and circuit configuration. In various embodiments, the reflective parabolic dish may be fixed relative to the UV sensor and include a reflective concave surface. The reflective concave surface may be configured to reflect narrow-band UV photons toward the UV sensor.

20 Claims, 4 Drawing Sheets

Related U.S. Application Data (60) Provisional application No. 62/576,747, filed on Oct. 25, 2017.

(51) Int. Cl.
  *B64C 39/02* (2006.01)
  *G01R 31/12* (2020.01)
  *G01J 1/02* (2006.01)
  *G01J 1/04* (2006.01)

(52) U.S. Cl.
  CPC ........ *G01J 1/0411* (2013.01); *G01R 31/1218* (2013.01); *H01J 47/08* (2013.01); *B64C 2201/12* (2013.01)

(56) References Cited

U.S. PATENT DOCUMENTS

| | | | |
|---|---|---|---|
| 10,171,756 | B2 | 1/2019 | Moore et al. |
| 10,962,650 | B2 | 3/2021 | Schubert et al. |
| 10,983,223 | B2 | 4/2021 | Moore et al. |
| 2007/0275344 | A1* | 11/2007 | Liu .................................. 433/29 |
| 2011/0036983 | A1* | 2/2011 | Ford .......................... 250/338.1 |
| 2015/0192459 | A1* | 7/2015 | Kvamme ................ G01J 1/0411 |
| 2016/0105649 | A1* | 4/2016 | Pettegrew |
| 2018/0337731 | A1* | 11/2018 | Taptic .............. H04B 10/25752 |

OTHER PUBLICATIONS

Newton, Isaac, "The Project Gutenberg eBook of Opticks" Aug. 23, 2010, available at http://www.gutenberg.org/ebooks/33504, last accessed on Apr. 20, 2018.

Engelhaupt, Darell, et al. "Autonomous Long-Range Open Area Fire Detection and Reporting", Thermosense XXVII, Proceedings of SPIE, 2005, pp. 164-175, vol. 5782.

Moore, Andrew, et al. "Autonomous Inspection of Electrical Transmission Structures with Airborne UV Sensors NASA Report on Dominion Virginia Power Flights of Nov. 2016", NASA/TM-2017-219611, May 1, 2017.

Moore, Andrew J., et al. "UAV Inspection of Electrical Transmission Infrastructure with Path Conformance Autonomy and Lidar-based Geofences, NASA Report on UTM Reference Mission Flights at Southern Company Flights Nov. 2016," Oct. 2017, NASA/TM 2017-219673.

Kim, Youngseok, et al. "The characteristics of UV strength according to corona discharge from polymer insulators using a UV sensor and optic lens", IEEE Transactions an Power Delivery, 2011, pp. 1579-1584, vol. 26 Issue 3.

Kim, Young-Seok, et al. "Measurement of corona discharge on polymer insulator through the UV rays sensor including optical lens" Solid Dielectrics (ICSD), Jul. 4-9, 2010, pp. 1-4, 10th IEEE International Conference, Potsdam, Germany.

Schubert, Matthew, et al. "Morphological processing of ultraviolet emissions of electrical corona discharge for analysis and diagnostic use," Dec. 2015, NASA TM 2015-218992.

Grum, F. et al., "Spectral emission of corona discharges," Applied Optics, vol. 15, No. 1, Jan. 1976, pp. 76-79.

Fomenkov, Igor et al., "Light sources for high-volume manufacturing EUV lithography: technology, performance, and power scaling," Adv. Opt. Techn., 6(3-4), 2017, pp. 173-186; < https://www.degruyter.com/document/doi/10.1515/aot-2017-0029/htm>.

Hamamatsu, Flame Sensor UVTRON®, R9454, R9533, Jun. 2010, 4 pages.

* cited by examiner

ULTRAVIOLET SENSING APPARATUS WITH MIRROR AMPLIFICATION

CROSS-REFERENCE TO RELATED PATENT APPLICATIONS

This patent application claims the benefit of and priority to U.S. Provisional Patent Application No. 62/576,747, filed on Oct. 25, 2017, and is a continuation-in-part and claims the benefit of and priority to U.S. patent application Ser. No. 15/086,350, filed on Mar. 31, 2016. The entire contents of each of the foregoing applications are hereby incorporated by reference.

STATEMENT REGARDING FEDERALLY SPONSORED RESEARCH OR DEVELOPMENT

The invention described herein was made in the performance of work under NASA contracts and by an employee of the United States Government and is subject to the provisions of the National Aeronautics and Space Act, Public Law 111-314, § 3 (124 Stat. 3330, 51 U.S.C. Chapter 201) and 35 U.S.C. § 202, and may be manufactured and used by or for the Government for governmental purposes without the payment of any royalties thereon or therefore. In accordance with 35 U.S.C. § 202, the contractor elected not to retain title.

BACKGROUND OF THE INVENTION

Compact Ultraviolet (UV) sensors promise to supplement or replace corona cameras for detection and localization of potential high voltage transmission line faults. Corona camera adoption is limited, at least in part, due to camera size, cost, and fragility. Compact UV sensor technology is superior in all three of these measures of market fitness. However, corona cameras have exquisite sensitivity to the weak UV photon flux density produced by coronas. Corona cameras are so sensitive that a user with limited training can spot a corona at a distance of 300 feet or more. In contrast, compact UV sensors without optical augmentation must be located within a few meters of a corona to sense it reliably. As a result, UV sensors have not been applied in inspection of high voltage transmission line applications.

BRIEF SUMMARY OF THE INVENTION

Systems, methods, and devices of the various embodiments may enable the detection and localization of power line corona discharges and/or electrical arcs by an unmanned aerial vehicle (UAV) including an ultraviolet (UV) sensor and a reflective parabolic dish. In various embodiments, the UV sensor may use the photoelectric effect to sense narrow-band UV photons in a Geiger-Mueller tube and circuit configuration. In various embodiments, the reflective parabolic dish may be a parabolic mirror that may amplify the corona detection capabilities of the UV sensor. In various embodiments, UV sensor and reflective parabolic dish assemblies may be configured to detect a UV signal strength equal to approximately 60 kV to 500 kV corona, higher than 500 kV (e.g., 1 million kV) corona, etc., at nearly twice the distance of un-augmented UV sensors. When carried on a UAV, the increased range achieved by embodiment UV sensor and reflective parabolic dish assemblies may permit standoff inspection distances that mitigate collision risk during autonomous flight, thereby supporting the use of UV sensors in high voltage transmission line applications.

In various embodiments, the UV sensor may be configured to detect narrow-band UV photons in a field of view facing in a first direction and the reflective parabolic dish may be fixed relative to the UV sensor. The reflective parabolic dish may include a reflective concave surface facing the UV sensor in a second direction. The reflective concave surface may be configured to reflect the narrow-band UV photons toward the UV sensor. In various embodiments, the reflective concave surface may be made of a reflective material, such as a metallic material, a metalize polymer, etc. In various embodiments, the reflective concave surface may be covered with various reflective materials, such as aluminum, zinc, tin, a reflective polymer, etc. In various embodiments, the UAV carrying the UV sensor and reflective parabolic dish may be any type UAV, such as a UAV with a rotor-based propulsion system, etc. In various embodiments, the reflective parabolic dish may be secured to the UAV such that the first and second directions are perpendicular to a forward flight path of the UAV or not perpendicular to the forward flight path (e.g., parallel to the forward flight path, offset at an angle between 0° and 90° to the forward flight path, etc.). In various embodiments, the reflective parabolic dish may have a focal length diameter ratio and/or a diameter selected based at least in part on the first and second directions' orientation relative to the forward flight path of the UAV. In various embodiments, the UV sensor may include a Geiger-Mueller tube disposed at a focal point of the reflective parabolic dish. In various embodiments, the reflective parabolic dish may be configured to reduce its wind resistance (e.g., the reflective parabolic dish may be perforated, etc.).

Various embodiments may provide a method for detection and localization of corona discharges and/or electrical arcs by a UAV. The method may include controlling the UAV by a processor of the UAV to fly the UAV along a selected route, and detecting, by the processor of the UAV, a corona or arc along the selected route based on UV measurements received from one or more embodiment UV sensor and reflective parabolic dish assembly carried by the UAV.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

As used herein, the term "computing device" refers to any one or all of cellular telephones, smart phones, personal or mobile multi-media players, personal data assistants (PDAs), laptop computers, personal computers, tablet computers, smart books, palm-top computers, wireless electronic mail receivers, multimedia Internet enabled cellular telephones, wireless gaming controllers, satellite or cable set top boxes, streaming media players, smart televisions, digital video recorders (DVRs), and similar electronic devices which include a programmable processor and memory and circuitry for performing the operations described herein.

Commercially available solar blind flame detectors using the photoelectric effect and gas multiplication to sense narrow-band (185 nm to 260 nm) ultraviolet (UV) photons in a Geiger-Mueller tube and circuit configuration can detect high voltage coronal discharge. While these devices have a wide (>90°) field of view, their detection range is not sufficient for safe corona detection in autonomous unmanned aerial vehicle (UAV) inspection flights. At high altitudes and at low altitudes far from vegetation and ground structures, Global Positioning System (GPS) accuracy is about two meters in latitude and longitude and approximately two times poorer in altitude accuracy (95% confidence interval). However, GPS can be unreliable near reflective ground structures, and GPS-based UAV positioning is correspondingly unreliable. Based at least in part on the unreliability of GPS-based UAV positioning, without careful manual piloting or bulky, high-precision positioning equipment, inspection standoff distances for UAV inspection flights must include a safety buffer for obstacle avoidance. For autonomous transmission line inspection with multi-rotor UAVs this additional safety buffer imposes a sensor range requirement, which may be approximately 6.1 meters (i.e., ~20 feet) to allow time for pilot intervention. This 6.1-meter safety buffer may be larger or smaller, depending on wind speeds, GPS accuracy, UAV specifications, regulatory requirements, and/or other considerations. Nonetheless, a safety buffer requirement, such as the 6.1-meter safety buffer requirement, has made the use of compact UV sensors without optical augmentation impractical for UAV based inspection of high voltage transmission lines because the compact UV sensors without optical augmentation must be located within a few meters of a corona to sense it reliably, i.e., closer than the safety buffer, such as the 6.1-meter safety buffer, requirement allows.

Optical focusing with a UV-transparent quartz lens has been used to almost double detection range of conventional solar blind flame detectors. However, quartz lenses are heavy and cost much more than the sensor, and the field of view for practical lenses is limited to about 10 degrees. Thus, UV-transparent quartz lenses have not provided a solution to the problems faced with using compact UV sensors on UAVs for inspection of high voltage transmission lines.

Systems, methods, and devices of the various embodiments may enable the detection and localization of power line corona discharges and/or electrical arcs by a UAV including a UV sensor and a reflective parabolic dish. In various embodiments, the UV sensor may use the photoelectric effect to sense narrow-band UV photons in a Geiger-Mueller tube and circuit configuration.

Various embodiments may use a shallow curvature parabolic mirror mounted on a side or downward facing position on a UAV for high voltage corona detection. The shallow curvature parabolic mirror may amplify the corona detection capabilities of the UV sensor. In accordance with various embodiments, a UV sensor may be augmented with a shallow parabolic mirror to extend detection range. In various embodiments, UV sensor-dish assemblies may be configured to detect a UV signal strength equal to approximately 60 kV to 500 kV corona, higher than 500 kV (e.g., 1 million kV) corona, etc., at nearly twice the distance of un-augmented UV sensors. The increased range afforded by the various embodiment UV sensor and reflective parabolic dish assemblies may permit standoff inspection distances that mitigate collision risk during autonomous flight. As such, the various embodiments may enable UAV based inspection as the various embodiments UV sensor-dish assemblies may detect UV signal strength equal to approximately 60 kV to 500 kV corona, higher than 500 kV (e.g., 1 million kV) corona, etc., at and/or beyond a safety buffer requirement for UAV obstacle avoidance, such as a 6.1-meter safety buffer requirement for UAV obstacle avoidance.

UV sensing apparatuses of the various embodiments may include UV sensors and reflective parabolic dishes of different diameters and/or focal length to diameter ratios (F/Ds) to enable the detection and localization of power line corona discharges and/or electrical arcs by a UAV including a UV sensor and a reflective parabolic dish. Design constraints for specific UAV and/or transmission line applications of the embodiment UV sensing apparatuses may govern the selection of the diameter and/or F/D of embodiment reflective parabolic dishes. For example, physical constraints of a UV sensor, a UAV, and/or the reflective parabolic dish itself may impact the selection of the diameter and/or F/D for an embodiment reflective parabolic dish. Additionally, optical constraints of the UV sensor may impact the selection of the diameter and/or F/D for an embodiment reflective parabolic dish. As a specific example, on a small to mid-sized UAV, a small reflective parabolic dish diameter of less than 12 inches (e.g., 8 inches or less, etc.) may best fit between the landing legs of the UAV. As another specific example, a short focal length of 8 inches or less may keep the UV sensor position within the vertical clearance provided by UAV landing gear. As a still further specific example, low curvature (i.e., a F/D of 0.5 or greater) may reduce edge-on wind resistance of the embodiment reflective parabolic dish. As one example, a F/D of 0.25 or greater for the reflective parabolic dish may reduce edge-on wind resistance in some configurations. As a further specific example, the UV sensor and reflective parabolic dish may be configured to have a directional gain sufficient to detect a reference UV signal at a range of most safety buffer requirements (e.g., 6.1 meters or greater). As another specific example, the UV sensor and reflective parabolic dish may be configured to have a beam width as wide as possible, given physical and range requirements, to maximize the angular detection window.

The reflective parabolic dishes of the various embodiments (i.e., the parabolic mirror enhancement) may enable stronger, more definite detection, such as at a distance of typical safety buffer requirements (e.g., a 6.1 m safety buffer, etc.), or greater than that of un-augmented UV sensors. As such, the reflective parabolic dishes of the various embodiments may amplify the corona detection capabilities of a UAV. This increased standoff distance improves safety for autonomous inspection with a UV sensing apparatus in accordance with various embodiments, since the increased standoff distance provides leeway for pilot intervention if autonomous navigation deteriorates.

In accordance with various embodiments, small diameter shallow-curvature mirror designs for reflective parabolic dishes may extend the range of a compact photoelectric UV sensor used for autonomous UAV-based electrical infrastructure inspection. The shallow curvature reflective parabolic dishes may amplify the corona detection capabilities of the UAV. A reflective parabolic dish diameter below 10 inches may provide advantages, such as being configured to fit on a small UAV. In addition, shallow reflective parabolic dish curvature may minimize edge-on wind resistance. The extended range may allow for positional uncertainty plus an additional standoff safety margin for manual correction of the UAV trajectory in the event of navigational deviation during autonomous flight. Reflective parabolic dishes, in accordance with some embodiments, meet the range requirements with angular sensitivity wide enough to allow for some margin of error in sensor pointing angle.

A UV sensing apparatus, in accordance with various embodiments, mounted on the bottom of a UAV may be configured to detect a UAV source at several points in a flight volume. In particular, the embodiment UV sensing apparatus, mounted on the UAV flown over the UV source emitting at a level close to that produced by a 100 kV 60 Hz corona, may detect the source. Accordingly, an UV sensing apparatus, in accordance with various embodiments, may produce reliable diagnostic results when used in high voltage electrical fault detection.

Figure 1:
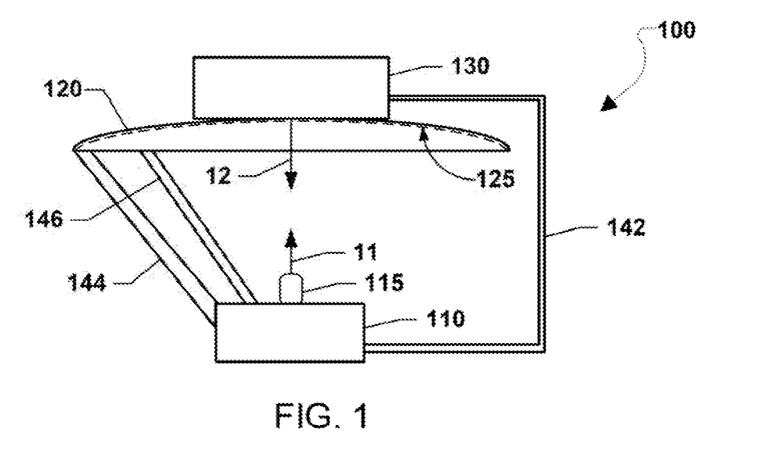
FIG. 1 is a schematic drawing of an ultraviolet (UV) sensor apparatus for measuring narrow-band UV photons, in accordance with various embodiments.

FIG. 1 illustrates a side elevation view of a UV sensing apparatus 100 in accordance with various embodiments. The UV sensing apparatus 100 may include a UV sensor 110 and a reflective parabolic dish 120 fixed relative to the UV sensor 110. The UV sensor 110 may be configured to detect narrow-band UV photons in a field of view facing in a first direction 11. The reflective parabolic dish 120 may include a reflective concave surface 125 facing the UV sensor 110 in a second direction 12. In some embodiments, the second direction 12 may be directly opposite the first direction 11. The reflective parabolic dish 120 may be used to augment UV detection by the UV sensor 110 in accordance with various embodiments. In various embodiments, the UV sensor 110 may be mounted at a focal point of the reflective parabolic dish 120. Light that travels parallel to an axis of symmetry of the reflective parabolic dish 120 and strikes its concave side will be reflected to a focal point of the reflective parabolic dish 120, regardless of where on the concave side the reflection occurs. Thus, the UV sensor 110 in accordance with various embodiments may be considered "augmented" once used in conjunction with the reflective parabolic dish 120 in accordance with various embodiments.

The UV sensor 110 may be fixed relative to the reflective parabolic dish 120 through a component housing 130 and/or one or more support arms 142, 144, 146. Each of the one or more support arms 142, 144, 146 may extend and be fixed relative to both the UV sensor 110 and the reflective parabolic dish 120 by way of the component housing 130. The component housing 130 may be separate from, or integral with, the reflective parabolic dish 120.

The UV sensing apparatus 100 of various embodiments may include a UV sensor 110 that includes a Geiger-Mueller tube 115 and readout circuitry, which may detect and measure photoelectric effects and the presence of UV photons. For example, the UV sensor 110 may include a Hamamatsu UVTron R13192 Flame sensor.

In various embodiments, the reflective parabolic dish 120 may be covered with a reflective substrate. The reflective substrate may be made of any reflective materials, such as at least one material selected from aluminum, zinc, tin, and reflective polymer (e.g., polymetric mirror films). This covering may be a coating or film applied to the reflective parabolic dish 120.

In various embodiments, the reflective parabolic dish 120 may be configured to have a F/D from between 0.0 and 1.0. In various embodiments, the F/D of the reflective parabolic dish 120 may 0.25 or greater than 0.25. For example, the F/D of the reflective parabolic dish 120 may be 0.25, greater than 0.25, 0.35, 0.525, 0.7, etc. F/Ds of 0.25 or greater may be beneficial when the reflective parabolic dish 120 is mounted to a UAV such that the first direction 11 and second direction 12 are perpendicular to a forward flight path of the UAV. In various embodiments, the reflective parabolic dish 120 may be configured to have any diameter. In various embodiments, the diameter of the reflective parabolic dish 120 may be less than 12 inches, such as 10 inches, 8 inches, 6 inches, 5 inches, 4 inches, etc. In some embodiments, the reflective parabolic dish 120 may be configured to have a diameter of 8 inches or less. Diameters of 8 inches or less for the reflective parabolic dish 120 may be beneficial when the reflective parabolic dish 120 is mounted to a UAV such that the first direction 11 and second direction 12 are not perpendicular to a forward flight path of the UAV.

In various embodiments, the reflective parabolic dish 120 may be configured to reduce, or minimize, its wind resistance. For example, the reflective parabolic dish 120 may be perforated to reduce its wind resistance.

In various embodiments, some creasing and other non-uniformity may be visible on the surface of the reflective parabolic dish 120. In various embodiments, the surface of the reflective parabolic dish 120 may be free from creases or otherwise uniform. In various embodiments, the spectral sensitivity of the UV sensor 110 may not be optimized to match coronal spectra to be measured. In various embodiments, the spectral sensitivity of the UV sensor 110 may match the coronal spectra to be measured.

Figure 2:
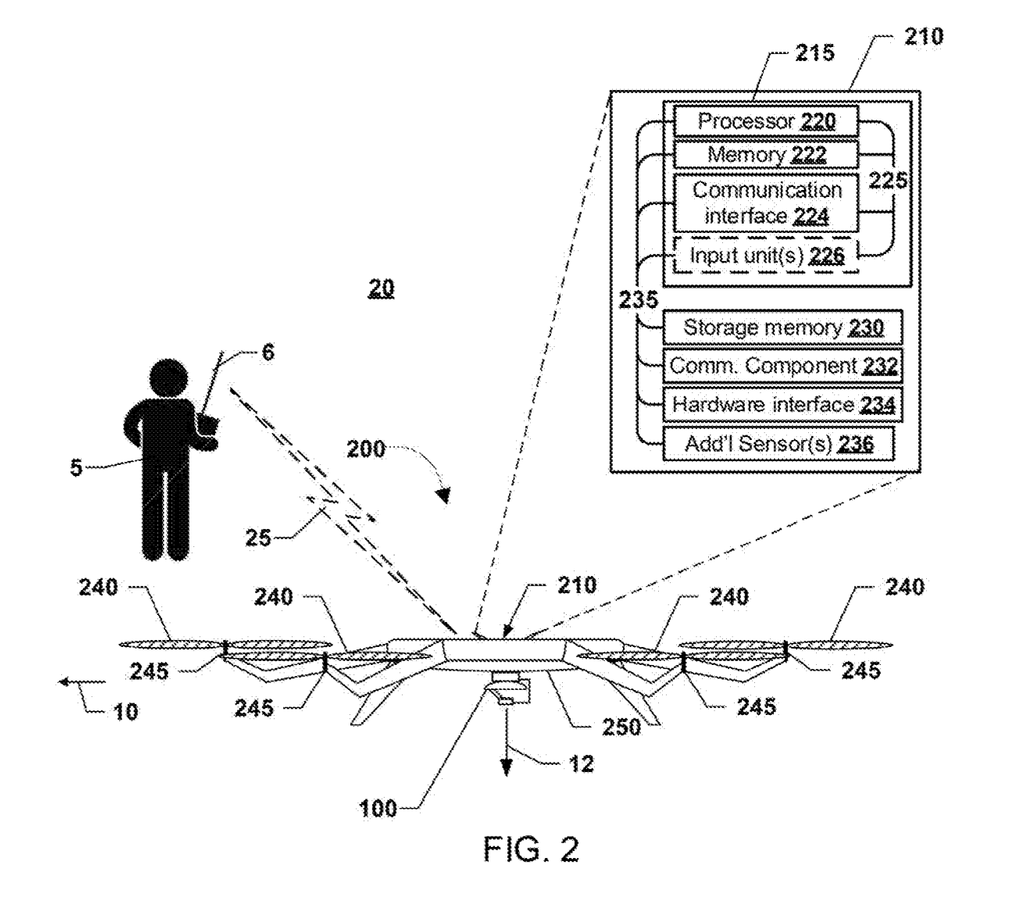
FIG. 2 is a block diagram illustrating components of an unmanned aerial vehicle (UAV) and an operator using a handheld controller suitable for use in various embodiments.

FIG. 2 illustrates a UAV 200 that includes the UV sensing apparatus 100 in accordance with various embodiments. The UAV 200 may also include a plurality of rotors 240, each driven by a corresponding motor 245. A body 250 of the UAV 200 may support the plurality of rotors 240, motors 245, and the UV sensing apparatus 100.

In various embodiments, the UV sensing apparatus 100 may be mounted on a lower surface of the UAV 200. Particularly, the UV sensing apparatus 100 may be mounted on a lower surface of the UAV 200 when the reflective parabolic dish 120 of the UV sensing apparatus 100 is configured to face perpendicular to a forward flight path of the UAV 200. For example, the second direction 12 may extend perpendicular to a direction of a forward flight path 10 of the UAV 200. In various embodiments, when the UV sensing apparatus is mounted on a lower surface of the UAV 200, the reflective parabolic dish 120 may have a F/D greater than 0.25. In other embodiments, the UV sensing apparatus 100 may be mounted on the UAV 200 such that the reflective parabolic dish 120 of the UV sensing apparatus 100 is configured to face other than perpendicular to a forward flight path of the UAV 200 (e.g., the second direction 12 is not extended perpendicularly to a forward flight path direction of the UAV 200). For example, the UV sensing apparatus 100, when mounted on a lower part of the UAV 200, may face into or obliquely to the forward flight path (e.g., some angle between 0° and 90° offset from the forward flight path of the UAV 200). In some embodiments, the UV sensing apparatus 100 may be mounted on a side surface of the UAV 200. Particularly, the UV sensing apparatus 100 may be mounted on a side surface of the UAV 200 when the reflective parabolic dish 120 of the UV sensing apparatus 100 is configured to face parallel to a forward flight path of the UAV 200 (e.g., the second direction 12 extends parallel to a forward flight path direction of the UAV 200). As yet a further alternative, the UV sensing apparatus 100, when mounted on a side surface of the UAV 200 may face obliquely or perpendicular to the forward flight path. In various embodiments, when the UV sensing apparatus 100 is mounted on a side surface and configured such that it is not facing parallel to the forward flight path of the UAV 200, the diameter of reflective parabolic dish may be less than 8 inches.

The UAV 200 may include a processing device 210 that may be coupled to each of the plurality of motors 245 that drive the rotors 240. The processing device 210 may be configured to monitor and control the various functionalities, sub-systems, and components of the UAV 200. For example, the processing device 210 may be configured to monitor and control various modules, software, instructions, circuitry, hardware, etc. related to propulsion, navigation, power management, sensor management, and/or stability management.

The processing device 210 may house various circuits and devices used to control the operation of the UAV 200 and/or the operation of the UV sensing apparatus 100. For example, the processing device 210 may include a processor 220 that directs the control of the UAV 200. The processor 220 may include one or more processors configured to execute processor-executable instructions (e.g., applications, routines, scripts, instruction sets, etc.) to control flight, antenna usage, sensor usage, and other operations of the UAV 200, including operations of various embodiments. In some embodiments, the processing device 210 may include memory 222 coupled to the processor 220 and configured to store data (e.g., flight plans, obtained sensor data, received messages/inputs, applications, etc.). The processor 220 and memory 222 may be configured as or be included within a system-on-chip (SoC) 215 along with additional elements such as (but not limited to) a communication interface 224, one or more input units 226, non-volatile storage memory 230, and a hardware interface 234 configured for interfacing the SoC 215 with hardware and components of the UAV 200. Components within the processing device 210 and/or the SoC 215 may be coupled together by various circuits, such as a bus 225, 235 or another similar circuitry.

In addition to the UV sensing apparatus 100, the UAV 200 may include one or more additional onboard sensors 236, such as one or more cameras, contact sensors, weight sensors, a radio-frequency identification reader, etc., that are coupled to the processor 220. The processing device 210 may be coupled to and/or further include one or more attitude sensors, such as an altimeter, a gyroscope, accelerometers, an electronic compass, and/or a satellite positioning system receiver, etc., that may be used by the processor 220 to determine vehicle attitude and location information for controlling flight and navigation.

In various embodiments, the processing device 210 may include or be coupled to one or more communication components 232, such as a wireless transceiver, an onboard antenna, and/or the like for transmitting and receiving wireless signals through the wireless communication link 25. The one or more communication components 232 may be coupled to the communication interface 224 and may be configured to handle wireless wide area network (WWAN) communication signals (e.g., cellular data networks) and/or wireless local area network (WLAN) communication signals (e.g., Wi-Fi signals, Bluetooth signals, etc.) associated with ground-based transmitters/receivers (e.g., base stations, beacons, Wi-Fi access points, Bluetooth beacons, small cells (picocells, femtocells, etc.), etc.). The one or more communication components 232 may receive data from radio nodes, such as navigation beacons (e.g., very high frequency (VHF) omni-directional range (VOR) beacons), Wi-Fi access points, cellular network base stations, radio stations, etc.

The processing device 210, using the processor 220, the one or more communication components 232, and an antenna may be configured to conduct wireless communications with a variety of remote computing devices, examples of which include a handheld controller 6, a base station or cell tower, a beacon, server, a smartphone, a tablet, or another computing device with which the UAV 200 may communicate. The processor 220 may establish the wireless communication link 25 via a modem and the antenna. In some embodiments, the one or more communication components 232 may be configured to support multiple connections with different remote computing devices using different radio access technologies. In some embodiments, the one or more communication components 232 and the processor 220 may communicate over a secured communication link. The security communication links may use encryption or another secure means of communication in order to secure the communication between the one or more communication components 232 and the processor 220.

The UAV 200 may operate in a mission environment 20, communicating with an operator 5 using the handheld controller 6 or a base station, which may provide a communication link to a remote computing device and/or a remote server via a communication network. The UAV 200 may be configured to communicate with remote computing devices and/or the remote server for exchanging various types of communications and data, including location information, navigational commands, data inquiries, and mission data.

UAVs may navigate or determine positioning using altimeters or navigation systems, such as Global Navigation Satellite System (GNSS), Global Positioning System (GPS), etc. In some embodiments, the UAV 200 may use an alternate source of positioning signals (i.e., other than GNSS, GPS, etc.). The UAV 200 may use position information associated with the source of the alternate signals together with additional information (e.g., dead reckoning in combination with last trusted GNSS/GPS location, dead reckoning in combination with a position of the UAV takeoff zone, etc.) for positioning and navigation in some applications. Thus, the UAV 200 may navigate using a combination of navigation techniques, including dead-reckoning, camera-based recognition of the land features below and around the UAV 200 (e.g., recognizing a road, landmarks, highway signage, etc.), etc. that may be used instead of or in combination with GNSS/GPS location determination and triangulation or trilateration based on known locations of detected wireless access points.

In some embodiments, the processing device 210 of the UAV 200 may use one or more of various input units 226 for receiving control instructions, data from human operators or automated/pre-programmed controls, and/or for collecting data indicating various conditions relevant to the UAV 200. For example, the input units 226 may receive input from one or more of various components, such as camera(s), microphone(s), position information functionalities (e.g., a global positioning system (GPS) receiver for receiving GPS coordinates), flight instruments (e.g., attitude indicator(s), gyroscope(s), anemometer, accelerometer(s), altimeter(s), compass(es), etc.), keypad(s), etc. The camera(s) may be optimized for daytime and/or nighttime operation.

UAVs may be winged or rotor craft varieties. For example, the UAV 200 may be a rotary propulsion design that utilizes one or more rotors 240 driven by corresponding motors to provide lift-off (or take-off) as well as other aerial movements (e.g., forward progression, ascension, descending, lateral movements, tilting, rotating, etc.). The UAV 200 is illustrated as an example of an UAV that may utilize various embodiments but is not intended to imply or require that various embodiments are limited to a quad-rotor aircraft. For example, UAVs used in the various embodiments may be fixed winged UAVs with propeller-based propulsion systems or any other type UAV.

In operation, the UAV 200 may be controlled by the processor 220 to detect UV emissions from coronas and/or arcs as the UAV 200 flies past a corona or arc. The processor 220 may monitor the outputs of the UV sensing apparatus 100, and when a UV reading indicative of a corona or arc is detected the processor 220 may adjust the orientation of the UAV 200 for inspection with additional sensors, such a camera. The processor 220 may analyze readings from the corona or arc and the results of the analysis may be sent from the processor 220 via communication interface 224 to another device, e.g., the handheld controller 6 used by an operator 5, a computer, server of a power company monitoring station, etc., to enable the operator 5 or other entity to use the results of the analysis, imagery of the corona or arc, indications/measurements of the corona or arc, and/or other data to take appropriate responses to the detected circumstances.

In an alternative embodiment, the analysis operations discussed above as performed by the processor 220 may be performed by a processor remote from the UAV 200, such as a processor of a ground station computer. In such an embodiment, the processor 220 may control the communication interface 224 to send data from the UAV 200 to the processor remote from the UAV 200, and the processor remote from the UAV 200 may analyze the data from the UV sensing apparatus 100 and/or other sensors to detect or analyze coronas or arcs as discussed herein.

Figure 3:
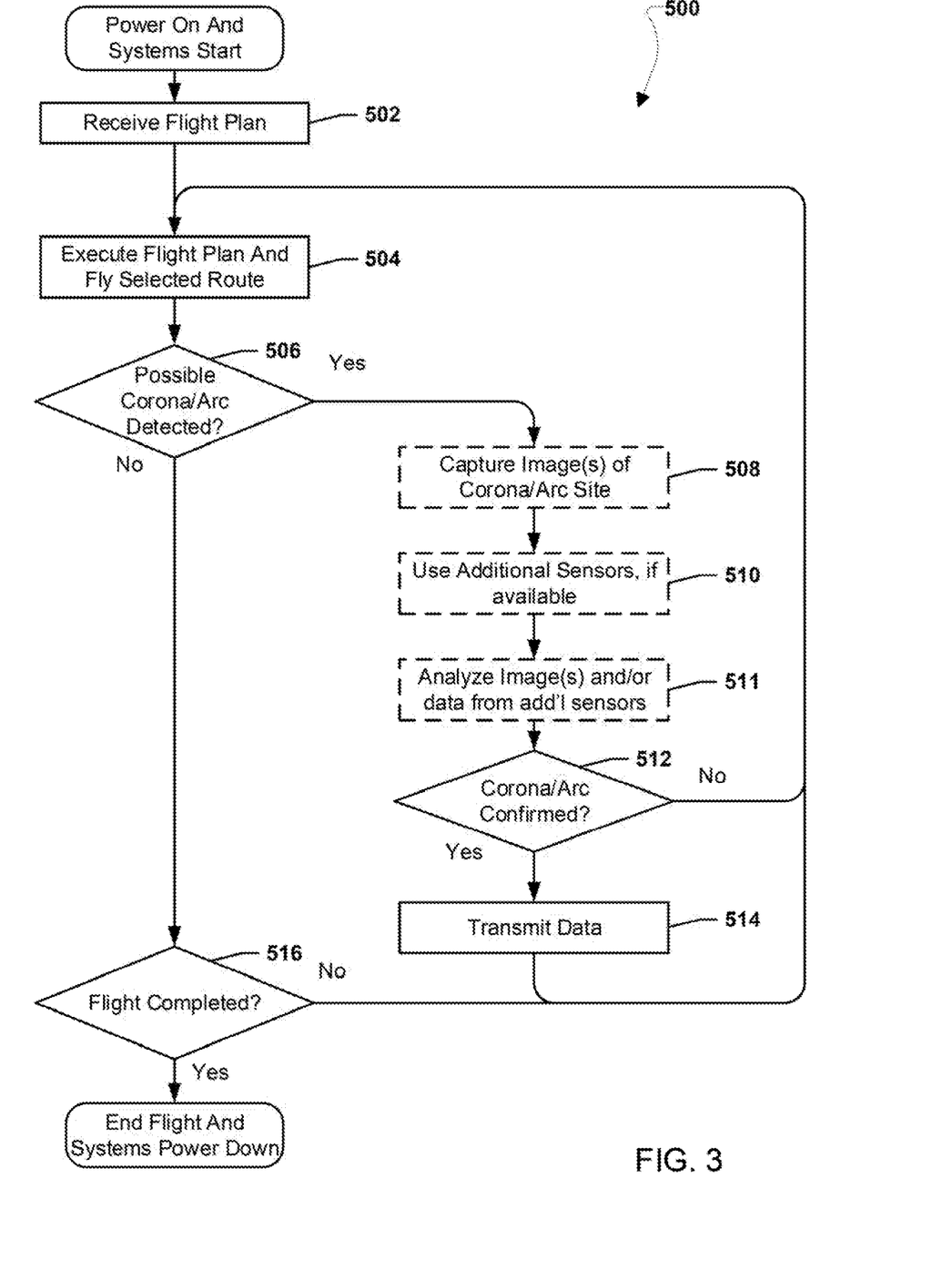
FIG. 3 is a process flow diagram illustrating an embodiment method for directional localization of power line coronas and/or arcs using a UV sensing apparatus, in accordance with various embodiments.

FIG. 3 illustrates an embodiment method 500 for directional localization of power line coronas and/or arcs using a UV sensing apparatus, in accordance with various embodiments. In an embodiment, the operations of method 500 may be performed by a processor (e.g., 220) of a UAV (e.g., 200) and/or a processor remote from the UAV, such as a processor of a controller (e.g., handheld controller 6) or a ground station computer. The operations of the method 500 may begin upon power on and system start of the UAV. At power on and system start the engines, positioning system, and other control systems of the UAV, as well as the UV sensing apparatus 100 and other sensors, may be powered on and begin operating (e.g., capturing UV measurements and video, logging position, providing thrust, etc.).

In block 502 a flight plan may be received by the processor of the UAV. For example, the flight plan may be a series of way points arranged along a set of power lines selected for monitoring. The series of way points may constitute a selected route for the UAV. As a specific example, the flight plan may be a flight plan compatible with NASA's Unmanned Aerial System Traffic Management (UTM) system.

In block 504 the processor may execute the flight plan and fly the UAV along the selected route. For example, the processor may control the UAV's engines, control surfaces, positioning system, power source, and any other on-board system as needed to fly the UAV from waypoint to waypoint along the selected route corresponding to the power lines to be inspected. Once the UAV arrives within close proximity (e.g., within 25 feet) of power lines intended for inspection, the processor of the UAV may activate the UV sensing apparatus (e.g., 100) and begin monitoring the outputs to determine whether a UV reading indicative of a corona or arc is detected.

In determination block 506 the processor may determine whether a possible corona or arc is detected. For example, the processor may periodically or continually sample (i.e., monitor) the outputs of the UV sensing apparatus to determine whether a UV source above a threshold is detected. In response to determining no possible corona or arc is detected (i.e., determination block 506="No"), the processor may determine whether the flight is completed in determination block 516. In response to determining the flight is not completed (i.e., determination block 516="No"), the processor may continue to execute the flight plan and fly the selected route as described above with reference to block 504 and continue to sample for possible coronas and arcs as described with reference to determination block 506.

In response to detecting a possible corona or arc (i.e., determination block 506="Yes"), in optional block 508 the processor may control the camera to capture one or more images in the region of the suspected corona or arc site. The camera may be one or more cameras configured to capture images in one or more bands of light, such as the visible-band, UV-band, infrared-band, or a combination thereof. As part of capturing images, the processor may orient a camera toward the corona or arc site. For example, the processor may compare the relative UV measurements from the UV sensing apparatus to identify a most likely direction for the corona relative the forward direction of travel of the UAV and may turn the UAV accordingly to focus the camera toward the corona or arc site. In optional block 510 the processor may activate one or more additional sensors in the direction of the region of the suspected coronas or arcs for collecting additional data to confirm the existence or precise nature of the coronas or arcs.

In optional block 511 the processor may analyze the images and/or data from the additional sensors, if any, of the corona or arc site. Analyzing the images of the corona or arc may include applying image processing techniques to the images to confirm whether or not a corona or arc is present in the images, to determine how many coronas or arcs may be present in the images, to identify the boundaries of any coronas or arcs in the images, to identify the center of the coronas or arcs in the images, and/or to apply indications to the images. In addition, the collected images may be correlated to data from other sensors, such as the UV sensing device and/or additional sensors, if any.

If one or more of optional blocks 508, 510, or 511 are not performed, in response to detecting a possible corona or arc (i.e., determination block 506="Yes"), the method 500 may proceed to determination block 512. Optional blocks 508, 510, 511 may be skipped if no onboard camera is available or if images are not necessary or would not benefit the analysis.

In determination block 512 the processor may determine or confirm whether any coronas or arcs were identified from the collected data (e.g., from the UV sensing device, images, and/or other sensors). In response to determining no coronas or arcs were identified (i.e., determination block 512="No"), the processor may return to executing the flight plan and fly the selected route as described above with reference to block 504 and continue to monitor for possible coronas and arcs as described with reference to determination block 506. In response to determining a corona and/or arc is present (i.e., determination block 512="Yes"), in block 514 the processor may transmit data to one or more connected devices, such as via a network connection established via communication interface. For example, the data transmitted may be data from the UV sensing apparatus, one or more images of the corona or arc, such as images including indications of regions of interest, data indicating the location of the UAV when the images were collected, data indicating the UV sensing apparatus or camera direction, etc. In response to transmitting the data, the processor may return to executing the flight plan and fly the selected route as described above with reference to block 504 and continue to monitor for possible coronas and arcs as described with reference to determination block 506.

In response to determining the flight is completed (i.e., determination block 516="Yes"), the processor may end the flight and power down appropriate systems.

FIGS. 4A-4E illustrate schematic side views of various UAVs with UV sensor apparatus in different configurations relative to a forward flight path of the UAV 200, in accordance with various embodiments.

Figure 4A:
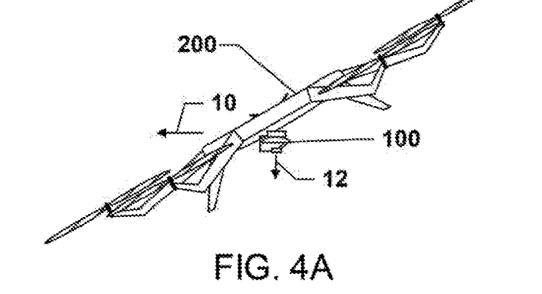
FIG. 4A is a schematic drawing of a UAV with a UV sensor apparatus facing perpendicular to a forward flight path of the UAV, in accordance with various embodiments.

In FIG. 4A, the UAV 200 includes the UV sensing apparatus 100 facing perpendicular to a forward flight path 10 of the UAV 200, in accordance with various embodiments. During forward flight, the UAV may dip (i.e., lower) a leading side of the UAV down in order to provide more efficient forward propulsion. The dip angle of the UAV (i.e., the angle of tilt) may be a known angle that is used to configure the UV sensing apparatus 100. In this way, an orientation angle of the UV sensor apparatus may be specifically configured relative to that forward flight dip angle or another desired flight configuration angle. For example, the direction that the reflective parabolic dish faces (i.e., the second direction 12) may be configured perpendicular to a forward flight path 10, as illustrated in FIG. 4A.

Figure 4B:
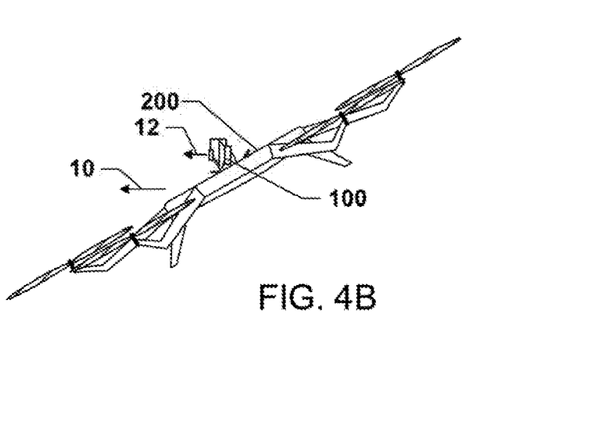
FIG. 4B is a schematic drawing of a UAV with a UV sensor apparatus facing in the direction of a forward flight path of the UAV, in accordance with various embodiments.

In FIG. 4B, the UAV 200 includes the UV sensing apparatus 100 facing in the same direction as the forward flight path 10 of the UAV 200, in accordance with various embodiments. In this way, the second direction 12 and a direction of the forward flight path 10 are not only parallel, but they are coincident.

Figures 4C, 4D:
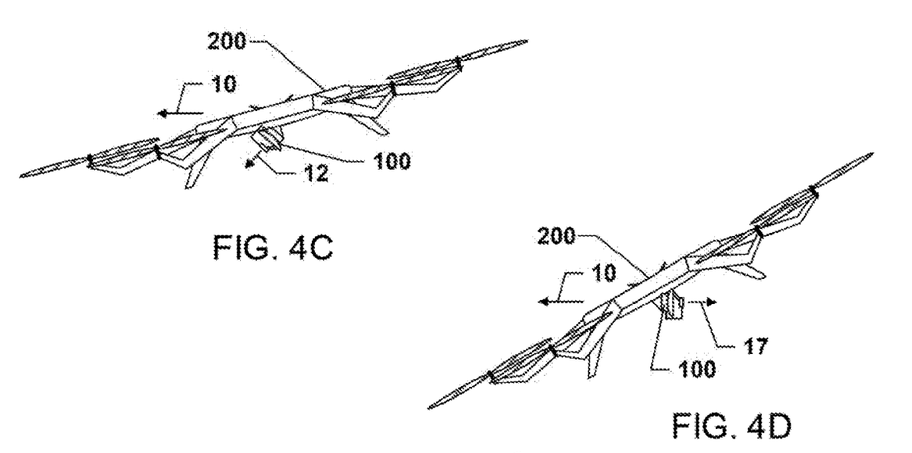
FIG. 4C is a schematic drawing of a UAV with a UV sensor apparatus facing at an oblique angle relative to a forward flight path of the UAV, in accordance with various embodiments.
FIG. 4D is a schematic drawing of a UAV with a UV sensor apparatus facing opposite a forward flight path of the UAV, in accordance with various embodiments.

In FIG. 4C, the UAV 200 includes the UV sensing apparatus 100 facing at an oblique angle relative to a forward flight path 10 of the UAV 200, in accordance with various embodiments. In this way, the second direction 12 is not perpendicular (i.e., neither perpendicular nor parallel) to the forward flight path 10.

In FIG. 4D, the UAV 200 includes the UV sensing apparatus 100 facing opposite to a forward flight path 10 of the UAV 200, in accordance with various embodiments. In this way, the second direction 12 and a direction of the forward flight path 10 are parallel, but directly opposed to one another.

Figure 4E:
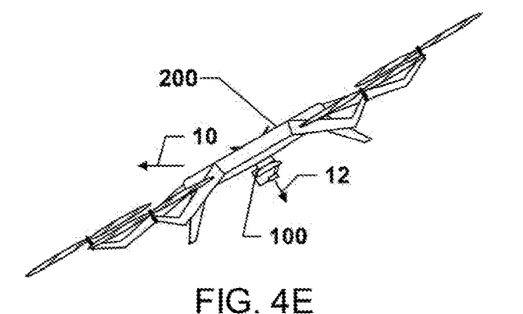
FIG. 4E is a schematic drawing of a UAV with a UV sensor apparatus facing away from and in an oblique direction to a forward flight path of the UAV, in accordance with various embodiments.

In FIG. 4E, the UAV 200 includes the UV sensing apparatus 100 facing at an oblique angle relative to a forward flight path 10 of the UAV 200, in accordance with various embodiments. Thus, similar to the configuration illustrated in FIG. 4C, in FIG. 4E the second direction 12 is not perpendicular (i.e., neither perpendicular nor parallel) to the forward flight path 10. However, in contrast to FIG. 4C, in FIG. 4E the UV sensor is facing away from the forward flight path 10 and downward.

Figure 5:
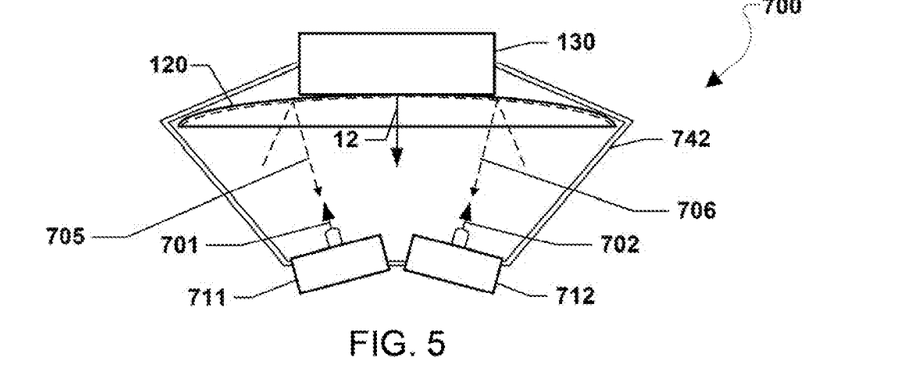
FIG. 5 is a schematic drawing of a UV sensor apparatus with more than one sensor for measuring narrow-band UV photons, in accordance with various embodiments.

FIG. 5 illustrates a side elevation view of a UV sensing apparatus 700 in accordance with various embodiments. The UV sensing apparatus 700 may include more than one UV sensor, such as UV sensors 711, 712, both facing the reflective parabolic dish 120 fixed relative thereto. Each of the UV sensors 711, 712 may be configured to detect the same narrow-band UV photons in a field of view facing in their respective first directions 701, 702. Alternatively, each of the UV sensors 711, 712 may be configured to detect different bands of UV photons in a respective field of view. The reflective parabolic dish 120 may include a reflective concave surface facing both UV sensors 711, 712 in the second direction 12. The reflective parabolic dish 120 may be a circular symmetrical shape. Alternatively, the reflective parabolic dish 120 may be elongate (e.g., the inner reflective concave surface may be shaped like a trough) in order to better face both the UV sensors 711, 712. The first directions 701, 702, in which the UV sensors 711, 712 face, may be toward the reflective parabolic dish 120 but not directly opposite the second direction 12.

The UV sensing apparatus 700 may be useful for simultaneously inspecting multiple conductors on one powerline. For example, since many powerlines have three conductors, having more than one UV sensor (e.g., UV sensors 711, 712) facing in different directions may enable inspection of more than one conductor at a time. In this way, the first directions 701, 702 may each be configured to face particular second directions 705, 706 of expected incoming UV photons.

The UV sensors 711, 712 may be fixed relative to the reflective parabolic dish 120 through the component housing 130 and/or one or more support arms 742. The one or more support arms 742 may extend and be fixed relative to both the UV sensors 711, 712 and the reflective parabolic dish 120 by way of the component housing 130. The component housing 130 may be separate from or integral with the reflective parabolic dish 120.

Figure 6:
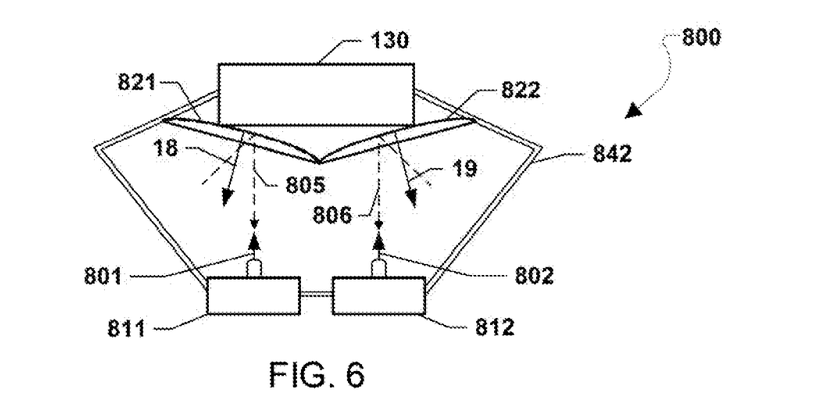
FIG. 6 is a schematic drawing of a UV sensor apparatus with more than one sensor, each facing a separate reflective parabolic dish, in accordance with various embodiments.

FIG. 6 illustrates a side elevation view of a UV sensing apparatus 800 in accordance with various embodiments. The UV sensing apparatus 800 may include more than one UV sensor, such as UV sensors 811, 812, both facing separate reflective parabolic dishes 821, 822 fixed relative thereto. Each of the UV sensors 811, 812 may be configured to detect the same narrow-band UV photons in a field of view facing in their respective first directions 801, 802. Alternatively, each of the UV sensors 811, 812 may be configured to detect different bands of UV photons in a respective field of view. Each of the reflective parabolic dishes 821, 822 may include a reflective concave surface facing in respective second directions 18, 19 at different ones of the UV sensors 811, 812. The reflective parabolic dishes 821, 822 may be a circular symmetrical shape.

Like the UV sensing apparatus 700, the UV sensing apparatus 800 may be useful for simultaneously inspecting multiple conductors on one powerline. In this way, the first directions 801, 802 may each be configured to face particular second directions 805, 806 of expected incoming UV photons. The first directions 801, 802, in which the UV sensors 811, 812 face, may be toward the respective reflective parabolic dishes 821, 822 but not directly opposite the second directions 18, 19. The first directions 801, 802 may each be configured to face particular second directions 805, 806 of expected incoming UV photons.

The UV sensors 811, 812 may be fixed relative to the reflective parabolic dishes 821, 822 through the component housing 130 and/or one or more support arms 842. The one or more support arms 842 may extend and be fixed relative to both the UV sensors 811, 812 and the reflective parabolic dishes 821, 822 by way of the component housing 130. The component housing 130 may be separate from or integral with the reflective parabolic dishes 821, 822.

Figure 7:
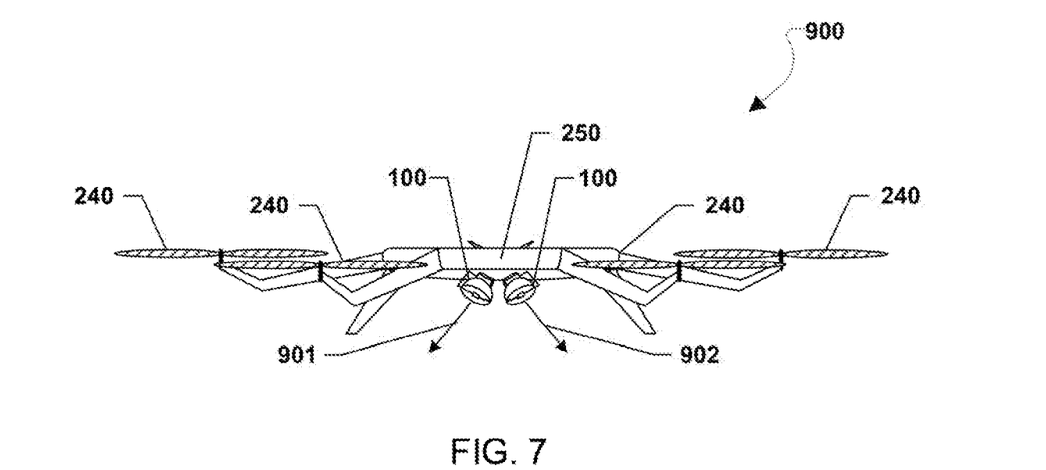
FIG. 7 is a schematic drawing of a UAV configured with more than one UV sensor apparatus, in accordance with various embodiments.

FIG. 7 illustrates a UAV 900 that includes more than one UV sensing apparatus 100, in accordance with various embodiments. Like UAV 200, described above with regard to FIG. 2, UAV 900 may include a plurality of rotors 240, each driven by a corresponding motor. Similarly, a body 250 of the UAV 900 may support the plurality of rotors 240, motors, and both of the UV sensing apparatus 100. The UAV 900 includes two UV sensing apparatus 100 but may include more UV sensor apparatus as desired. Each of the UV sensing apparatus 100 may be mounted on a lower surface of the UAV 900 and configured to face in different directions 901, 902.

By including more than one UV sensing apparatus 100, the UAV 900 may be useful for simultaneously inspecting multiple conductors on one powerline. For example, the different directions 901, 902 may each be configured to face particular directions of expected incoming UV photons from different conductors. Providing a third UV sensor apparatus may be useful to inspect three powerline conductors simultaneously.

The different directions 901, 902 may both face downwardly and toward a forward flight path (e.g., 10) of the UAV 900. In addition, the different directions 901, 902 may at least partially face opposed lateral sides of the UAV 900. Alternatively, the different directions 901, 902 may both face rearward to the forward flight path.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module and/or processor-executable instructions, which may reside on a non-transitory computer-readable or non-transitory processor-readable storage medium. Non-transitory server-readable, computer-readable or processor-readable storage media may be any storage media that may be accessed by a computer or a processor. By way of example but not limitation, such non-transitory server-readable, computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, DVD, floppy disk, and Blu-ray disc where disks usually reproduce data magnetically, while discs reproduce data optically with lasers. Combinations of the above are also included within the scope of non-transitory server-readable, computer-readable and processor-readable media. Additionally, the operations of a method or algorithm may reside as one or any combination or set of codes and/or instructions on a non-transitory server-readable, processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. An ultraviolet (UV) sensing apparatus configured to detect narrow-band UV photons emitted from a high voltage corona discharge, comprising:
   a UV sensor configured to detect narrow-band UV photons emitted from a high voltage corona discharge in a field of view facing in a first direction; and
   a reflective dish fixed relative to the UV sensor, wherein the reflective dish includes a reflective concave surface facing the UV sensor in a second direction, wherein the reflective concave surface is configured to reflect the narrow-band UV photons toward the UV sensor.

2. The UV sensing apparatus of claim 1, wherein the UV sensor is configured to detect UV light of 185 nm to 260 nm.

3. The UV sensing apparatus of claim 2, wherein the UV sensor includes a Geiger-Mueller tube, and a portion of the Geiger-Mueller tube is disposed at a focal point of the reflective dish.

4. The UV sensing apparatus of claim 1, wherein the reflective concave surface is metallic.

5. The UV sensing apparatus of claim 1, wherein the reflective concave surface is a metalized polymer.

6. The UV sensing apparatus of claim 1, wherein the reflective concave surface is covered with at least one material selected from aluminum, zinc, tin, and reflective polymer.

7. The UV sensing apparatus of claim 1, further comprising:
   an unmanned aerial vehicle (UAV) carrying the UV sensor and the reflective dish, wherein the UAV includes a set of rotors for propulsion.

8. The UV sensing apparatus of claim 7, wherein the reflective dish is secured to the UAV such that the first and second directions are perpendicular to a forward flight path of the UAV.

9. The UV sensing apparatus of claim 8, wherein at least a portion of the reflective concave surface is parabolic and defines a focal length to diameter ratio greater than 0.25.

10. The UV sensing apparatus of claim 7, wherein the reflective dish is secured to the UAV such that the first and second directions are not perpendicular to a forward flight path of the UAV.

11. The UV sensing apparatus of claim 10, wherein a diameter of the reflective dish is less than 8 inches or is perforated.

12. An unmanned aerial vehicle (UAV) system, comprising:
   a UAV body;
   an ultraviolet (UV) sensing apparatus coupled to the UAV body, wherein the UV sensing apparatus includes a UV sensor facing a reflective concave surface of a reflective dish, wherein the UV sensor is configured to detect narrow-band UV photons emitted from a high voltage corona discharge and reflected off the reflective concave surface; and
   a processor in communication with the UV sensing apparatus, wherein the processor is configured with processor-executable instructions to perform operations comprising:
      controlling a flight control of the UAV to fly the UAV along a selected route; and
      determining whether a corona or arc is detected along the selected route based on UV measurements received from the UV sensing apparatus, wherein the corona or arc is generated by a power system.

13. The UAV of claim 12, wherein the UV sensor is configured to detect UV light of 185 nm to 260 nm.

14. The UAV of claim 12, wherein the reflective concave surface is metallic.

15. The UAV of claim 12, wherein the reflective concave surface is covered with at least one material selected from aluminum, zinc, tin, and reflective polymer.

16. The UAV of claim 12, wherein the UV sensing apparatus is configured to detect the narrow-band UV photons from a first direction and the reflective dish is secured to the UAV facing in a second direction, wherein the first and second directions are perpendicular to a forward flight path of the UAV.

17. The UAV of claim 16, wherein the reflective dish includes a focal length to diameter ratio greater than 0.25.

18. The UAV of claim 12, wherein the reflective dish is secured to the UAV such that the first and second directions are not perpendicular to a forward flight path of the UAV.

19. The UAV of claim 18, wherein at least a portion of the reflective concave surface is parabolic and a focal length of the reflective concave surface is less than 8 inches or is perforated.

20. A method for detection and localization of corona discharges or electrical arcs by an unmanned aerial vehicle (UAV), comprising:
   controlling a flight control of the UAV by a processor of the UAV to fly the UAV along a selected route; and
   detecting, by the processor of the UAV, a corona or arc along the selected route based on ultraviolet (UV) measurements received from a UV sensing apparatus on the UAV, wherein the UV sensing apparatus includes a UV sensor facing a reflective concave surface of a reflective parabolic dish, wherein the UV sensor is configured to detect narrow-band UV photons reflected off the reflective concave surface.

* * * * *